(12) United States Patent
Gabry et al.

(10) Patent No.: US 10,924,137 B2
(45) Date of Patent: Feb. 16, 2021

(54) APPARATUS AND METHOD FOR GENERATING POLAR CODES

(71) Applicant: Huawei Technologies Co., Ltd., Shenzhen (CN)

(72) Inventors: Frederic Gabry, Munich (DE); Valerio Bioglio, Boulogne-Billancourt (FR); Jean-Claude Belfiore, Boulogne-Billancourt (FR); Ingmar Land, Boulogne-Billancourt (FR)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/443,105

(22) Filed: Jun. 17, 2019

(65) Prior Publication Data

US 2019/0305799 A1 Oct. 3, 2019

Related U.S. Application Data

(63) Continuation of application No. PCT/EP2016/082555, filed on Dec. 23, 2016.

(51) Int. Cl.
*H03M 13/00* (2006.01)
*H03M 13/13* (2006.01)
*H03M 13/03* (2006.01)

(52) U.S. Cl.
CPC ......... *H03M 13/13* (2013.01); *H03M 13/033* (2013.01); *H03M 13/616* (2013.01)

(58) Field of Classification Search
CPC ... H04L 1/0045; H04L 1/0061; H04L 1/0058; H04L 1/0067; H04L 1/0041;
(Continued)

(56) References Cited

U.S. PATENT DOCUMENTS 9,356,626 B2 5/2016 Alexeev et al.
2015/0194987 A1 7/2015 Li et al.

FOREIGN PATENT DOCUMENTS

CN 103023618 A 4/2013
CN 103684477 A 3/2014
(Continued)

OTHER PUBLICATIONS

Arikan, Erdal, "Channel Polarization: A Method for Constructing Capacity-Achieving Codes for Symmetric Binary-Input Memoryless Channels," IEEE Transactions on Information Theory, vol. 55, No. 7, Jul. 2009, 23 pages.
(Continued)

*Primary Examiner* — Guerrier Merant
(74) *Attorney, Agent, or Firm* — Slater Matsil, LLP

(57) ABSTRACT

A method for generating a polar code $c_N$ of length N and dimension K, on the basis of a generator matrix $G_N$ of size N×N, is provided. The method includes generating a distance spectrum vector $d_{T_p} = (d_{T_p}(1), \ldots, d_{T_p}(p))$ of size p of the kernel $T_p$, wherein $d_{T_p}(h)$, $h=1, \ldots, p$, corresponds to a maximum value among all possible minimum distances of all possible polar codes of size p and dimension h generated on the basis of the kernel $T_p$. The method also includes generating a distance spectrum vector $d_{G_N}$ of size N of the generator matrix $G_N$ on the basis of the distance spectrum vector $d_{T_p}$, determining the set of K information bit indices I on the basis of the distance spectrum vector $d_{G_N}$, and generating the polar code $c_N$ on the basis of the set of K information bit indices I.

20 Claims, 7 Drawing Sheets

(58) Field of Classification Search
CPC ....... H04L 1/0072; H04L 1/0038; H04L 1/00;
H04L 1/0068; H04L 1/0057; H04L 5/006;
H04L 1/20; H04L 1/0046; H04L 1/0026;
H04W 48/16; H03M 13/635; H03M
13/13; H03M 13/033; H03M 13/616
See application file for complete search history.

(56) References Cited

FOREIGN PATENT DOCUMENTS

| EP | 2936721 A1 | 10/2015 |
|---|---|---|
| KR | 20110060635 A | 6/2011 |
| WO | 2014098480 A1 | 6/2014 |
| WO | 2018033206 A1 | 2/2018 |

OTHER PUBLICATIONS

Vangala, Harish et. al., "A Comparative Study of Polar Code Constructions for the AWGN Channel", pre-print arXiv:1501.02473, Jan. 11, 2015, 9 pages.

Wang, Runxin et. al., "A Novel Puncturing Scheme for Polar Codes", IEEE Communications Letters, vol. 18, No. 12, Dec. 12, 2014, 4 pages.

Zhang, Liang et. al., "On the Puncturing Patterns for Punctured Polar Codes", IEEE International Symposium on Information Theory, Jul. 2014, pp. 121-125.

Niu, Kai et. al., "Beyond Turbo Codes: Rate-Compatible Punctured Polar Codes", IEEE ICC, Jun. 2013, pp. 3423-3427.

Tal, Ido et.al, "List Decoding of Polar Codes," in IEEE Intenational Symposium on Information Theory Processings, Jul. 2011, 5 pages.

Li, Bin et al., "A RM-Polar Codes", fFactory Pro trial version, www.pdffactory.com, XP55270196A, Submitted on Jul. 21, 2014, 2 pages.

Lee, Myung-Kyu et al.,"The Exponent of a Polarizing Matrix Constructed from the Kronecker Product", arXiv:1108.3417, Submitted to IEEE Transactions on Information Theory, arXiv:1108.3417v1 (cs.IT), Jul. 27, 2011, 8 pages.

Chen, Peiyao et al., "Design of Polar Coded 64-QAM", 2016 9th International Symposium on Turbo Codes and Iterative Information Processing (ISTC), XP32981303A, Sep. 5-9, 2016, 5 pages.

Gabry, Frederic et al.,"Multi-Kernel Construction of Polar Codes", arXiv:1612.06099, Submitted on Dec. 19, 2016, 4 pages.

Lin, Hsien-Ping et al.,"Binary Kernel Matrices of Maximum Exponents of Polar Codes of Dimensions Up to Sixteen", IEEE Information Theory and Applications Workshop (ITA), Feb. 1-6, 2015, 6 pages.

Hadi, Ammar et al., "On Enhancing the Minimum Hamming Distance of Polar Codes", IEEE 17th International Workshop on Signal Processing Advances in Wireless Communications (SPAWC), Jul. 3-6, 2016, 5 pages.

Liu, Zhenzhen et al., "Performance Analysis of Polar Codes Based on 3×3 Kernel Matrix", Aug. 12-15, 5 pages.

APPARATUS AND METHOD FOR GENERATING POLAR CODES

CROSS-REFERENCE TO RELATED APPLICATIONS

This application is a continuation of International Application No. PCT/EP2016/082555, filed on Dec. 23, 2016, the disclosure of which is hereby incorporated by reference in its entirety.

TECHNICAL FIELD

In general, embodiments of the present invention relate to data encoding and decoding in communication systems. More specifically, the present invention relates to an apparatus and method for generating polar codes.

BACKGROUND

Reliable transmission of data over noisy communication channels generally requires some kind of error correction coding to be used. Polar codes were shown to achieve the Shannon capacity of many channels. See, E. Arikan, "Channel polarization: A method for constructing capacity achieving codes for symmetric binary-input memoryless channels", IEEE Trans. on Inf. Theory, vol. 55, no. 7, pp. 3051-3073, July 2009).

In their original or classical construction as specified in the above mentioned work by Arikan, polar codes are based on the polarization effect generated by the Kronecker products of the following kernel:

$$T_2 = \begin{pmatrix} 1 & 0 \\ 1 & 1 \end{pmatrix}.$$

In general, a classical polar code of length N and dimension K is defined by a generator matrix $G_N = T_2^{\otimes n}$, $N=2^n$, and a set of frozen bit indices $F \subset [N]$, $[N] = \{0, 1, \ldots, N-1\}$, wherein the size of the set of frozen bit indices F is given by $|F| = N-K$. A set of K information bit indices I is defined as the complementary set of the set of frozen bit indices, namely $I = [N] \setminus F$, and therefore $|I| = K$.

In order to encode the K information bits into a polar code or codeword $c_N$ of length N, the elements $u_i$ of a binary input vector $u_N$ of length N are set equal to zero for $i \in F$ and equal to the K information bits for $i \in I$. Then, the encoded polar code $c_N$ can be obtained as:

$$c_N = u_N \cdot G_N.$$

According to the classical construction of polar codes, the effective generator matrix $G_N$ is a sub-matrix of $T_2^{\otimes n}$ formed by rows of $T_2^{\otimes n}$. As a consequence, only polar codes having a length of powers of 2, namely $N=2^n$, can be generated. Therefore, given a code dimension (i.e. number of information bits) K, classical polar codes admit only a polar code rate $R=K/N$, under the condition that N is a power of 2.

The relationship between the input vector $u_N$ and the polar code $c_N$ can also be represented by a Tanner graph. An example of such a graph is provided in FIG. 1, wherein N=8 and $G_8 = T_2^{\otimes 3}$. In particular, in FIG. 1, the three stages result from $n=3$, and $P^{-1}$ denotes the inverse bit-reversal permutation of length 8 (for more details, see the aforementioned work by Arikan). This graph is also the basis for decoding algorithms used to decode the polar code $c_N$ in order to get the input vector $u_N$ and, therefore, the K encoded information bits.

As already mentioned above, a major drawback of the polar codes constructed by making use of only one kernel, i.e. $T_2$, is that the code lengths are restricted to powers of 2, i.e., $N=2^n$. This is not sufficient to cover the diversity of block lengths demanded by modern communication systems. Using the so-called puncturing or shortening techniques from coding theory, the codes can be trimmed to any code length (see, e.g., "A Novel Puncturing Scheme for Polar Codes", by Wang et. al., IEEE Comm. Lett., December 2014, "On the Puncturing Patterns for Punctured Polar Codes", IEEE ISIT, July 2014, by Zhang et. al., and "Beyond Turbo Codes: Rate-Compatible Punctured Polar Codes", IEEE ICC, June 2013, by C. Kai et al.). However, the main shortcomings of puncturing and shortening techniques of original polar codes is the lack of structure of the frozen sets and puncturing or shortening patterns generated by these methods. In particular, every modified code has a completely different set of frozen bit indices and puncturing or shortening pattern that has to be stored or calculated on the fly. Hence, these methods are not practical to implement due to their high latency and are not simple to describe in a systematic manner, such as tables of nested sets. Moreover, puncturing and shortening lead to a loss of performance compared to a full code.

Another approach to overcome the problem of the length of polar codes, which makes use of constructions of generator matrices based on several kernels, is disclosed in PCT/EP2016/069593. On the basis of this approach, multi-kernel polar codes of lengths N that are not only powers of two can be constructed. In particular, the original polar codes constructed on the basis of the kernel $T_2$ are a sub-case of multi-kernel polar codes wherein the block length N is a power of 2. In general, multi-kernel polar codes have a good performance while the encoding complexity remains low, and the decoding follows the same general structure as for usual binary kernel codes. In particular, the original polar codes constructed on the basis of the kernel $T_2$ are a sub-case of multi-kernel polar codes where the block length N is a power of 2. The multi-kernel construction of polar codes largely increases the number of code lengths that can be achieved without making use of the techniques of puncturing or shortening. However, the performance of multi-kernel polar codes crucially depends on the kernels which are used to construct the generator matrix.

Furthermore, in the construction of polar codes, besides the importance of determining a good generator matrix $G_N$, the generation of the set of information bit indices plays also a very important role. In fact, the main idea behind the classical construction of polar codes is that, based on successive-cancellation (SC) decoding, some bit indices of the input vector $u_N$ can be more reliable than other bit indices in terms of transmission probability or reliability, and this is also known as the polarization phenomenon, and thus the name "polar code".

In a current system, the information bits are put in the most reliable positions of the input vector $u_N$, while the unreliable positions are fixed to the bit value 0, also called frozen bits. The reliability of input bit positions can be obtained, for example, by density evolution algorithms, genie-aided simulation, or other similar methods (e.g., see "A comparative study of polar code constructions for the AWGN channel," by H. Vangala et. al, arXiv:1501.02473, 2015). Such a construction of polar codes is appropriate especially for long codes under SC decoding. However, for short codes under list decoding, such a construction of polar codes, and, in particular, of multi-kernel polar codes does not provide a good block error rate (BLER) performance. This is due to the fact that this construction relies on the polarization effect as mentioned above, and polarization needs a large code length to be effective. Thus, for short code lengths, the polarization does not occur. Moreover, the density evolution algorithm employed in the calculation of the reliabilities of the bits is quite complex, and this increases the latency of the encoder used to encode the input vector $u_N$ and of the decoder used to decode the polar code $c_N$ in order to obtain $u_N$. In particular, this is an important issue for short codes, where the complexity of the density evolution algorithm is significant compared to the encoding complexity.

Thus, there is a need for an improved apparatus and method for generating a polar code in a less complex manner.

SUMMARY

It is an object of the invention to provide for an improved apparatus and method for generating a polar code in a less complex manner.

The foregoing and other objects are achieved by the subject matter of the independent claims. Further implementation forms are apparent from the dependent claims, the description and the figures.

According to a first aspect, embodiments of the present invention relate to an apparatus for generating a polar code $c_N$ of length N and dimension K, on the basis of a generator matrix $G_N$ of size N×N, wherein the generator matrix $G_N$ is based on a kernel $T_p$ of size p×p, with p≤N. The polar code $c_N$ is given by $c_N=u_N \cdot G_N$, wherein $u_N=(u_0, \ldots, u_{N-1})$ is a vector of size N, $u_i$, i=0, ... N−1, corresponding to an information bit if i∈I, I being a set of K information bit indices, and $u_i$=0, if i∈F, F being a set of N−K frozen bit indices. The apparatus comprises a processor configured to: generate a distance spectrum vector $d_{T_p}=(d_{T_p}(1), \ldots, d_{T_p}(p))$ of size p of the kernel $T_p$, wherein $d_{T_p}(h)$, h=1, ..., p, corresponds to a maximum value among all possible minimum distances of all possible polar codes of size p and dimension h generated on the basis of the kernel $T_p$. The processor is also configured to generate a distance spectrum vector $d_{G_N}$ of size N of the generator matrix $G_N$ on the basis of the distance spectrum vector $d_{T_p}$. The processor is also configured to determine the set of K information bit indices I on the basis of the distance spectrum vector $d_{G_N}$, and generate the polar code $c_N$ on the basis of the set of K information bit indices I.

Thus, an improved apparatus for generating a polar code in a less complex manner is provided.

In a first possible implementation form of the apparatus according to the first aspect as such, p=3 and the kernel $T_3$ is given by the following equation:

$$T_3 = \begin{pmatrix} 1 & 1 & 1 \\ 1 & 0 & 1 \\ 0 & 1 & 1 \end{pmatrix}.$$

In a second possible implementation form of the apparatus according to the first implementation form of the first aspect, the generator matrix $G_N$ is given by the following equation:

$$G_N = G'_n \otimes T_3,$$

wherein $G'_n$ represents a first additional generator matrix and $\otimes$ represents the Kronecker product operator.

In a third possible implementation form of the apparatus according to the second implementation form of the first aspect, the processor is further configured to generate the distance spectrum vector $d_{G_N}$ of the generator matrix $G_N$ on the basis of the following equation:

$$d_{G_N} = d_{G'_n} \otimes d_{T_3},$$

wherein $d_{G'_n}$ is the distance spectrum vector of the first additional generator matrix $G'_n$ and $d_{T_3}=(3,2,1)$ is the distance spectrum vector of the kernel $T_3$.

In a fourth possible implementation form of the apparatus according to the first aspect as such, p=5 and the kernel $T_5$ is given by following equation:

$$T_5 = \begin{pmatrix} 1 & 1 & 1 & 1 & 1 \\ 1 & 0 & 0 & 0 & 0 \\ 1 & 0 & 0 & 1 & 0 \\ 1 & 1 & 1 & 0 & 0 \\ 0 & 0 & 1 & 1 & 1 \end{pmatrix}.$$

In a fifth possible implementation form of the apparatus according to the fourth implementation form of the first aspect, the generator matrix $G_N$ is given by the following equation:

$$G_N = G''_m \otimes T_5,$$

wherein $G''_m$ represents a second additional generator matrix and $\otimes$ represents the Kronecker product operator.

In a sixth possible implementation form of the apparatus according to the fifth implementation form of the first aspect, the processor is further configured to generate the distance spectrum vector $d_{G_N}$ of the generator matrix $G_N$ on the basis of the following equation:

$$d_{G_N} = d_{G''_m} \otimes d_{T_5},$$

wherein $d_{G''_m}$ is the distance spectrum vector of the second additional generator matrix $G''_m$ and $d_{T_5}=(5,3,2,1,1)$ is the distance spectrum vector of the kernel $T_5$.

In a seventh possible implementation form of the apparatus according to the first aspect as such or any one of the first to sixth implementation form thereof, the first row of the kernel $T_p$ has a maximum Hamming weight among all rows of the kernel $T_p$.

In an eighth possible implementation form of the apparatus according to the seventh implementation form of the first aspect, the generator matrix $G_N$ can be written as follows:

$$G_N = G_q \otimes G_p,$$

wherein $G_q$ is a third generator matrix of a code of size q and $G_p$ is a fourth generator matrix of a code of size p, and wherein, in order to generate the set of K information bit indices I. The processor is further configured to: generate a vector:

$$r_{G_p} = (d_{G_p}(1), d_{G_p}(p-1), d_{G_p}(p-2) \ldots, d_{G_p}(2), d_{G_p}(2)) \text{ of size } p.$$

The processor is further configured to generate an auxiliary vector:

$$r'_{G_p} = (d_{G_p}(p), d_{G_p}(p-1), d_{G_p}(p-2) \ldots, d_{G_p}(2), d_{G_p}(2)) \text{ of size } p.$$

The processor is further generate a vector $r_{G_N} = d_{G_q}^{rev} \otimes r_{G_p}$ of size q·p, wherein the vector $d_{G_q}^{rev}$ is the reverse of a distance spectrum vector $d_{G_q}$, $d_{G_q}$ being the distance spectrum vector of the third generator matrix $G_q$. The processor is further configured to generate a vector: $r'_{G_N} = d_{G_q}^{rev} \otimes r'_{G_p}$. The processor is further configured to determine, for $i=1, \ldots, K$, a position l of the last largest entry of the vector $r_{G_N}$. The processor is further configured to add l to the set of K information bit indices I. The processor is further configured to set $r_{G_N}(l)$ equal to zero. The processor is further configured to remove, if $l=0 \mod p$, from the set of frozen bit indices F, an index t equal to $l-p+1$. The processor is further configured to substitute the index t by $l-1$. The processor is further configured to set $r_{G_p}(l-1)=0$; and set $r_{G_p}(l-p+1)=r'_{G_p}(l-p+1)$.

According to a second aspect, embodiments of the present invention relate to a communication apparatus comprising a channel encoder comprising an apparatus for generating a polar code according to the first aspect as such or any one of the first to eighth implementation form thereof.

According to a third aspect, embodiments of the present invention relate to a communication apparatus comprising a channel decoder comprising an apparatus for generating a polar code according to the first aspect as such or any one of the first to eighth implementation form thereof.

According to a fourth aspect, embodiments of the present invention relate to a method for generating a polar code $c_N$ of length N and dimension K on the basis of a generator matrix $G_N$ of size N×N, wherein the generator matrix $G_N$ is based on a kernel $T_p$ of size p×p, with $p \leq N$. The polar code $c_N$ is given by $c_N = u_N \cdot G_N$, wherein $u_N = (u_0, \ldots, u_{N-1})$ is a vector of size N, $u_i$, $i=0, \ldots N-1$, corresponding to an information bit if $i \in I$, I being a set of K information bit indices, and $u_i = 0$, if $i \in F$, F being a set of N−K frozen bit indices. The method comprises: generating a distance spectrum vector $d_{T_p} = (d_{T_p}(1), \ldots, d_{T_p}(p))$ of size p of the kernel $T_p$, wherein $d_{T_p}(h)$, $h=1, \ldots, p$, corresponds to a maximum value among all possible minimum distances of all possible polar codes of size p and dimension h generated on the basis of the kernel $T_p$. The method also includes generating a distance spectrum vector $d_{G_N}$ of size N of the generator matrix $G_N$ on the basis of the distance spectrum vector $d_{T_p}$, determining the set of K information bit indices I on the basis of the distance spectrum vector $d_{G_N}$, and generating the polar code $c_N$ on the basis of the set of K information bit indices I.

Thus, an improved method for generating a polar code in a less complex manner is provided.

The method according to the fourth aspect of the embodiments of the present invention can be performed by the apparatus according to the first aspect of the invention. Further features of the method according to the fourth aspect of the embodiments of the preset invention result directly from the functionality of the apparatus according to the first aspect of the embodiments of the present invention and its different implementation forms.

According to a fifth aspect, embodiments of the present invention relate to a computer program comprising a program code for performing the method according to the fourth aspect when executed on a computer.

The invention can be implemented in hardware and/or software.

BRIEF DESCRIPTION OF THE DRAWINGS

Further embodiments of the invention will be described with respect to the following figures, wherein.

In the various figures, identical reference signs will be used for identical or at least functionally equivalent features.

DETAILED DESCRIPTION OF ILLUSTRATIVE EMBODIMENTS

In the following description, reference is made to the accompanying drawings, which form part of the disclosure, and in which are shown, by way of illustration, specific aspects in which the present invention may be placed. It is understood that other aspects may be utilized and structural or logical changes may be made without departing from the scope of the present invention. The following detailed description, therefore, is not to be taken in a limiting sense, as the scope of the present invention is defined by the appended claims.

For instance, it is understood that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

Figure 1:
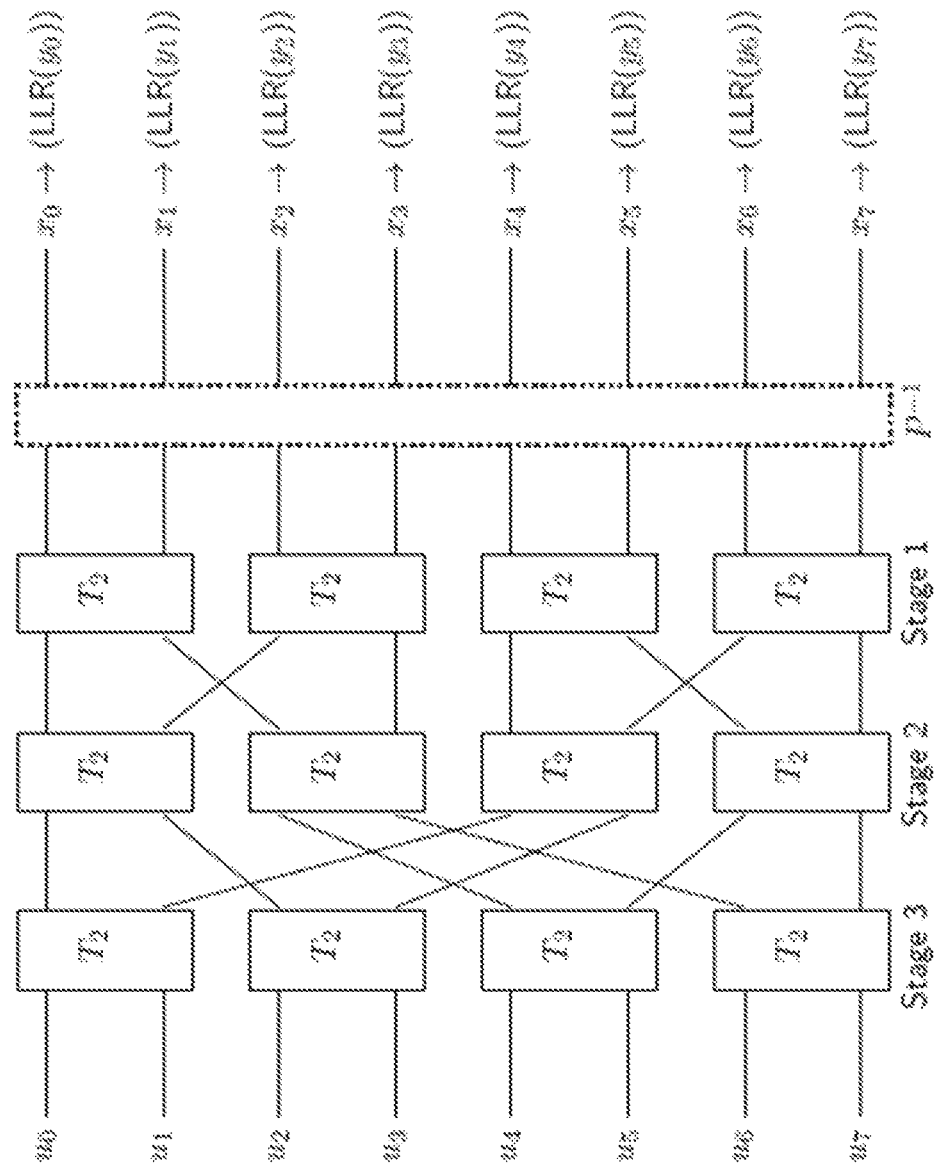
FIG. 1 shows a schematic diagram illustrating a conventional polar code of length 8.
Figure 2:
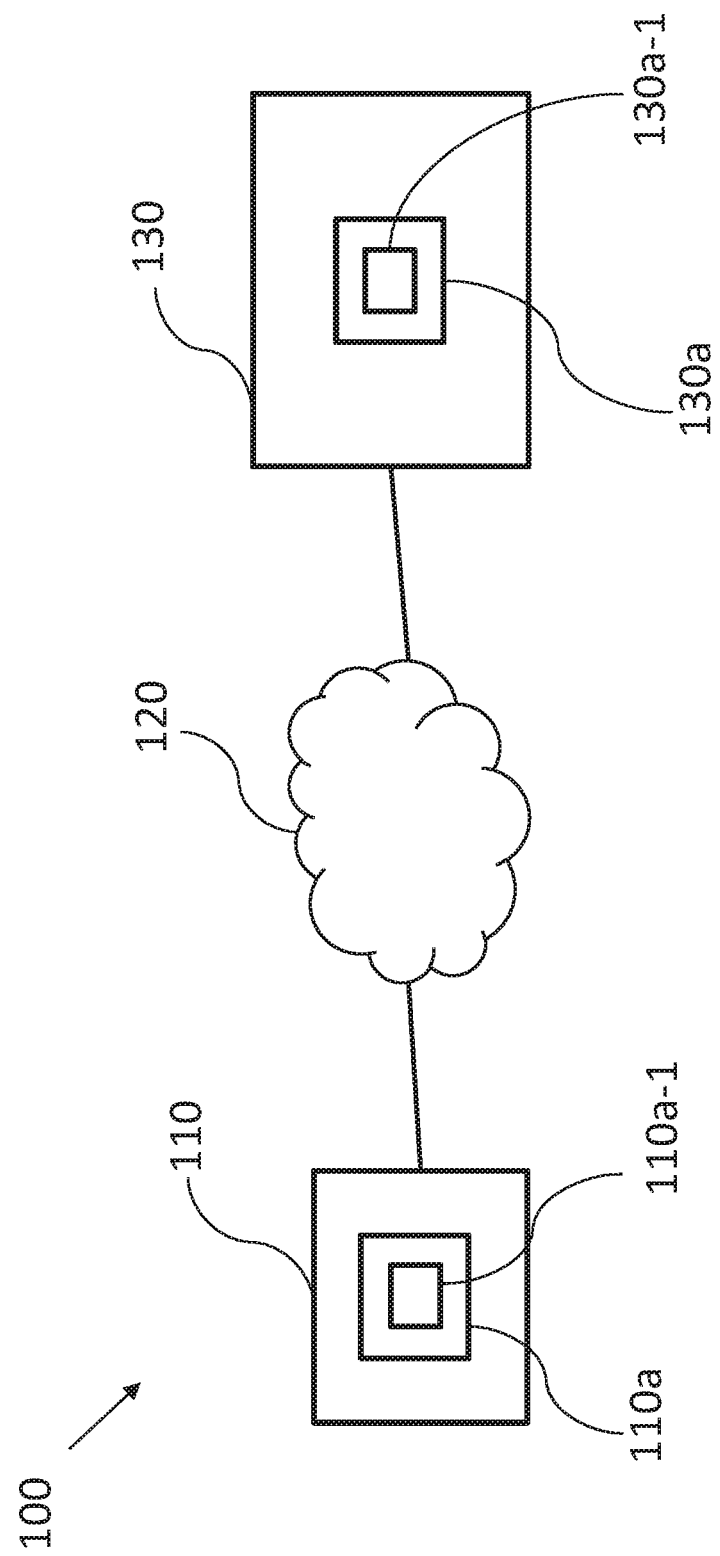
FIG. 2 shows a schematic diagram of a communication system comprising a channel encoder comprising an apparatus for generating a polar code according to an embodiment and a channel decoder encoder comprising an apparatus for generating a polar code according to an embodiment.

FIG. 2 shows a schematic diagram of a communication system 100 comprising a channel encoder 110 comprising an apparatus 110a for generating a polar code according to an embodiment. In this embodiment, the channel encoder 110 is in communication with a channel decoder 130 via a communication channel 120. The channel encoder 110 can be configured to send an encoded polar code or codeword $c_N$ to the channel decoder 130. Moreover, the channel decoder 130 can comprise an apparatus 130a for decoding the polar code $c_N$ by means of a processor 130a-1. In an embodiment, the apparatus 130a of the channel decoder 130 can be identical to the apparatus 110a of the channel encoder 110.

The apparatus 110a can generate the polar code $c_N$ of length N and dimension K, on the basis of a generator matrix $G_N$ of size N×N, wherein the generator matrix $G_N$ is based on a kernel $T_p$ of size p×p, with $p \leq N$, wherein the polar code $c_N$ is given by $c_N = u_N \cdot G_N$, wherein $u_N = (u_0, \ldots, u_{N-1})$ is a vector of size N, $u_i$, $i=0, \ldots N-1$, corresponding to an information bit if $i \in I$, I being a set of K information bit indices, and $u_i = 0$, if $i \in F$, F being a set of N−K frozen bit indices. The apparatus 110a comprises a processor 110a-1, wherein the processor 110a-1 is configured to perform the following steps: (i) generate a distance spectrum vector $d_{T_p} = (d_{T_p}(1), \ldots, d_{T_p}(p))$ of size p of the kernel $T_p$, wherein $d_{T_p}(h)$, $h=1, \ldots, p$, corresponds to a maximum value among all possible minimum distances of all possible polar codes of size p and dimension h generated on the basis of the kernel $T_p$, (ii) generate a distance spectrum vector $d_{G_N}$ of size N of the generator matrix $G_N$ on the basis of the distance spectrum vector $d_{T_p}$, (iii) determine the set of K information bit indices I on the basis of the distance spectrum vector $d_{G_N}$, and (iv) generate the polar code $c_N$ on the basis of the set of K information bit indices I.

Thus, as will be appreciate, in an embodiment of the invention, the generation of the polar code $c_N$ can be divided into two main steps: firstly, the generator matrix $G_N$ having good distance properties is constructed, and then the set of K information bit indices of the polar code or of the multi-kernel polar code is generated on the basis of the distance properties of the generator matrix $G_N$, as will be described in more detail in the following.

In embodiment of the invention, for codes having short lengths, the kernel $T_p$ can be constructed in such a way that the code distance is taken into account. For a given kernel $T_p$, the minimum distance of a code based on $T_p$ is closely related to the minimum Hamming weight of vectors in the space spanned by the rows selected to generate the set of K information bit indices I. In multi-kernel polar codes, the number of rows of $G_N$ to be selected depends on the number of information bits, namely on K. Traditionally (see e.g., the aforementioned work by Arikan), the rows of $G_N$ are selected according to a transmission reliability order, namely the K information bits are put in the K most reliable positions of the input vector $u_N$, while the unreliable positions (frozen bits) are fixed to the bit value o. As a result, codes of same length but different dimension are nested, i.e., the set of information bit indices of the code of a smaller rate is a subset of the set of information bit indices of the code of a larger rate, differently from embodiments of the present invention, where different subsets of rows for different information set sizes are selected. In this way, the information sets of codes of different dimension may not be nested.

In embodiments of the invention, for p=3, the kernel $T_3$ of size 3×3 is given by:

$$T_3 = \begin{pmatrix} 1 & 1 & 1 \\ 1 & 0 & 1 \\ 0 & 1 & 1 \end{pmatrix}.$$

This kernel shows polarization effects similar to the one shown by the conventional kernel $T_2$, and shows optimal properties in terms of the distance profile.

In embodiments of the invention, p=5 and the kernel $T_5$ is given by following equation:

$$T_5 = \begin{pmatrix} 1 & 1 & 1 & 1 & 1 \\ 1 & 0 & 0 & 0 & 0 \\ 1 & 0 & 0 & 1 & 0 \\ 1 & 1 & 1 & 0 & 0 \\ 0 & 0 & 1 & 1 & 1 \end{pmatrix}.$$

In order to better elucidate some advantages of the generation of polar codes according to embodiments of the present invention compared to prior art solutions, the distance spectrum vector $d_{T_3}$ of the kernel $T_3$ according to embodiments of the invention is calculated in the following.

Since the kernel $T_3$ has a size of 3×3, only codes of size 3 having a dimension K=1, 2 or 3 can be generated: $c_3 = u_3 \cdot T_3$.

If K=1, one row i of the kernel $T_3$ can be selected, or equivalently the information bit can be put in the i-th component of the input vector $u_3$. In particular, in order to maximize the minimum distance of the polar code $c_3$, the first row (1 1 1) is selected, giving a minimum distance 3. Any other row selection would result in a smaller minimum distance, namely 2. In fact, the only possible non-zero input sequences for $u_3$ are {1 0 0}, {0 1 0}, and {0 0 1}, for the first, second and third bits being chosen as information bits, respectively. This results in the codes or codewords $c_3$: {111}, {101}, {011}, which have minimum distances 3, 2, and 2, respectively. Therefore, by choosing the first row, the codeword having maximum value, i.e. 3, among all possible values of the minimum distances is obtained. In particular, in case K=1, the obtained set of codewords corresponds to the rows of the generator matrix, which in this case is $T_3$.

If K=2, the possible input vectors are given by: u(2,3)={001,010,011}, if the two information bits are put into the last two rows of the kernel $T_3$ (or equivalently correspond to the second and third elements of the input vector $u_3$); u(1,3)={101,001,100}, if the two information bits are put into the first and third row of $T_3$, respectively, and, analogously, u(1,2)={100,010,110}. The corresponding polar codes or codewords are given by: c(2,3)={011,101,110} (having minimum distance 2), c(1,3)={100,011,111} (having minimum distance 1), and c(1,2)={111,101,010} (having minimum distance 1), respectively. Therefore, in order to maximize the minimum distance among all possible minimum distances among all possible codewords, the last two rows $$\begin{pmatrix} 1 & 0 & 1 \\ 0 & 1 & 1 \end{pmatrix}$$

of $T_3$ can be selected to place the two information bits, generating a code of minimum distance equal to 2.

If K=3, then all the rows of $T_3$ have to be selected to put the 3 information bits. Namely, all non-zero input vectors are given by: $u_3$={001,010,100,011,101,110,111} which results in a minimum distance 1 (since e.g. c(110)=010 has weight 1). Therefore, the distance spectrum vector $d_3$ in this embodiment in given by: $d_3$=(3,2,1).

The classical construction of the distance spectrum vector on the basis of the reliability of the transmission selects the last row for dimension 1, the last two rows for dimension 2, and all rows for dimension 3. This results in the classical distance spectrum vector $d_3$=(2,2,1).

By comparing the distance spectrum vector used in embodiments of the invention and the classical distance spectrum vector, it can be seen that the construction of the polar code according to embodiments of the invention achieves a larger distance for dimension 1 (K=1) than the conventional construction based on reliabilities of the transmission.

In embodiments of the invention, the generator matrix $G_N$ is given by the Kronecker product of various kernels, e.g. $T_2$ and $T_3$. In this case, the generated code $c_N$ is a multi-kernel polar code and shows polarization properties. It can be proved that the distance spectrum vector of the Kronecker product of two or more kernels is given by the Kronecker product of the distance spectrum vectors of the kernels, sorted in descending order. This property can be used to easily calculate the distance spectrum vector of a multi-kernel code designed according to embodiments of the invention.

Figure 3:
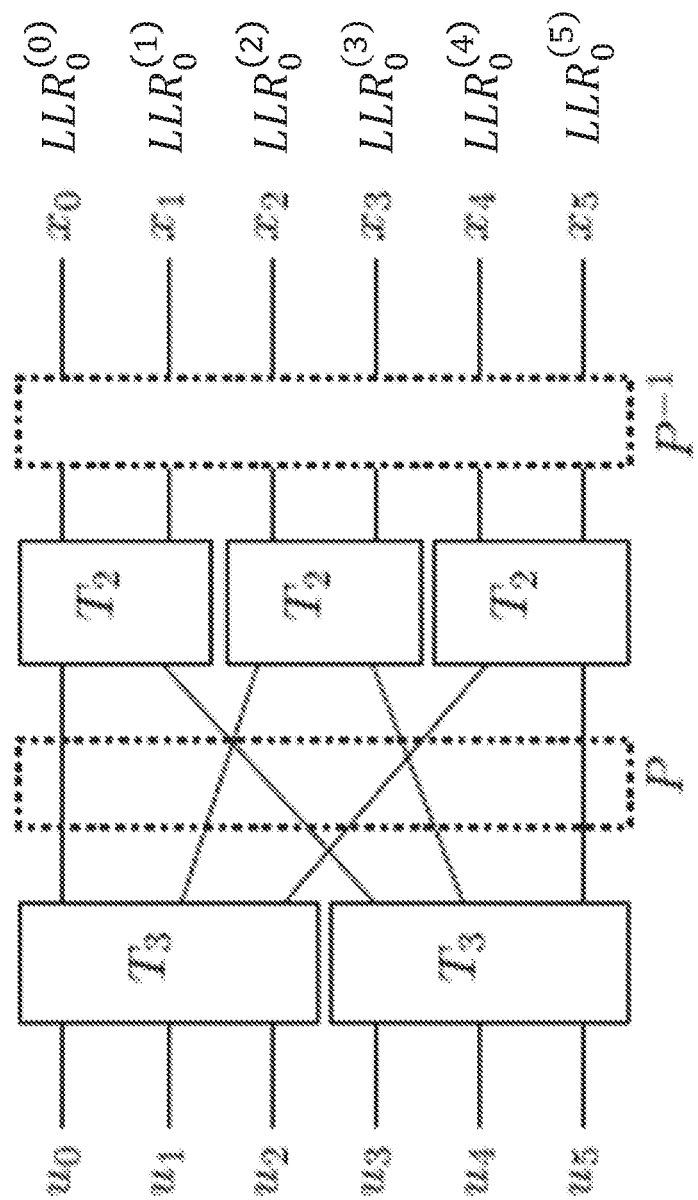
FIG. 3 shows a schematic diagram illustrating a polar code of length 6 according to an embodiment.

In order to better elucidate the construction of multi-kernel polar codes and of their distance spectrum vectors, in FIG. 3 a schematic construction of a Tanner graph of a multi-kernel polar code of length 6 according to embodiments of the invention is shown, wherein P denotes an edge permutation and $P^{-1}$ its inverse, and wherein the generator matrix $G_6$ is given by:

$$G_6 = T_2 \otimes T_3 = \begin{pmatrix} T_3 & 0 \\ T_3 & T_3 \end{pmatrix} = \begin{pmatrix} 1 & 1 & 1 & 0 & 0 & 0 \\ 1 & 0 & 1 & 0 & 0 & 0 \\ 0 & 1 & 1 & 0 & 0 & 0 \\ 1 & 1 & 1 & 1 & 1 & 1 \\ 1 & 0 & 1 & 1 & 0 & 1 \\ 0 & 1 & 1 & 0 & 1 & 1 \end{pmatrix}.$$

In this embodiment, a code $c_6$ of length 6 is obtained as $c_6 = u_6 \cdot G_6$, wherein $u_6$ is an input vector of length 6 comprising K information bits and N-K frozen bits.

As mentioned above, in order to calculate the distance spectrum vector of $G_6$, the Kronecker product of the distance spectrum vectors of $T_2$ and $T_3$ can be calculated according to the following formula:

$$d_6 = d_2 \otimes d_3 = (2,1) \otimes (3,2,1) = (6,4,2,3,2,1),$$

wherein $d_2 = (2,1)$ is the distance spectrum of the kernel $T_2$. Sorting the result in descending order, the distance spectrum vector of $G_6$ can be obtained for the minimum distance construction, namely: (6,4,3,2,2,1). This means that sets of information bit indices can be selected in order to obtain a code of dimension K=1 with minimum distance 6, of dimension K=2 with minimum distance 4, etc. On the other hand, the distance spectrum vector according to of the classical reliability construction is given by: (4,4,2,2,2,1). In this case as well, the construction of the polar code according to embodiments of the invention shows better distance properties compared to prior art constructions.

In embodiments of the invention, the distance spectrum vector $d_{G_N}$ of the generator matrix $G_N$ determines which minimum distance is achievable for a given dimension K. Once the distance spectrum vector $d_{G_N}$ is generated, the remaining task to generate the polar code $c_N$ is to determine the set of K information bit indices I in order to achieve this minimum distance. In embodiments of the invention, the following algorithm (herein also referred to as row selection algorithm) can be used to determine the set of K information bit indices I, such that the polar code has the minimum distance as defined in the distance spectrum vector.

In embodiments of the invention, the kernel $T_p$ with distance spectrum $d_{T_p} = (d_{T_p}(1), \ldots, d_{T_p}(p))$, wherein $d_{T_p}(i)$ represents the minimum distance of the polar code of dimension i, has the following structure: the first row is the row with the maximum Hamming weight, while the other rows, when selected starting from the last row to the second row, provide the desired distance. For small kernel sizes, this is not a strong limitation, since kernels with good spectra can be designed respecting this property. As an example, the $T_3$ kernel presented previously has this property. In an embodiment, the following algorithm is used to generate the set of K information bit indices I.

As first, the distance spectrum of the kernel is used to create a vector $r_{T_p}$, defined as $r_{T_p} = (d_{T_p}(1), d_{T_p}(p-1), d_{T_p}(p-2) \ldots, d_{T_p}(2), d_{T_p}(2))$, along with an auxiliary vector $r'_{T_p}$ defined as $r'_{T_p} = (d_{T_p}(p), d_{T_p}(p-1), d_{T_p}(p-2) \ldots, d_{T_p}(2), d_{T_p}(2))$. The difference between $r_{T_p}$ and its auxiliary vector $r'_{T_p}$ is given by the first element. If the generator matrix $G_N$ can be written as $G_N = G_q \otimes G_p$, i.e., with $G_p$ at the rightmost position of the Kronecker product, then the algorithm comprises the steps explained in the following.

First, the vector $r_{G_N} = d_{G_q}^{rev} \otimes r_{G_p}$ and the vector $r'_{G_N} = d_{G_q}^{rev} \otimes r'_{G_p}$ are calculated, wherein $d_{G_q}^{rev}$ is the reverse of $d_{G_q}$. Due to the fact that for a code of dimension K, K row indices are required for the information set, the algorithm adds sequentially one row index per step to the information set. At each step, the position l of the last largest entry in $r_{G_N}$ is found, and l is added to the set of information bit indices, while $r_{G_N}(l)$ is set to zero. However, if l=0 mod p, then by construction $r_{G_N}(l-p+1)$ is in the set of frozen bit indices, since in $r_{G_p}(1)$ is larger than the other elements of $r_{G_p}$, while $r_{G_N}(l-1)$ is not in the set of K information bit indices I, since $r_{G_p}(p) = r_{G_p}(p-1)$. Otherwise, l-p+1 is removed by the set of frozen bit indices and substituted by l-1, while the algorithm sets $r_{G_p}(l-1) = 0$ and $r_{G_p}(l-p+1) = r'_{G_p}(l-p+1)$. The algorithm stops when the set of information bit indices I includes K elements. Afterwards, the remaining N-K elements are stored in the set of frozen bit indices F.

This algorithm finds an optimal solution if only one kernel of size larger than 2 is used in the multi-kernel construction. It may also be applied in the case of multiple kernels of size larger than 2, leading to good results, as demonstrated by simulations illustrated in FIGS. 4, 5, and 6. Generalizations of the proposed algorithm are also possible.

In order to better elucidate the steps of the row selection algorithm according to embodiments of the invention, the set of information bit indices I obtained for the exemplary generator matrix $G_6$ described above is shown in table 1, wherein $$G_6 = \begin{pmatrix} 1 & 1 & 1 & 0 & 0 & 0 \\ 1 & 0 & 1 & 0 & 0 & 0 \\ 0 & 1 & 1 & 0 & 0 & 0 \\ 1 & 1 & 1 & 1 & 1 & 1 \\ 1 & 0 & 1 & 1 & 0 & 1 \\ 0 & 1 & 1 & 0 & 1 & 1 \end{pmatrix}, r_6 = \begin{pmatrix} \mathbf{3} \\ 2 \\ 2 \\ 6 \\ 4 \\ 4 \end{pmatrix} \text{ and } r'_6 = \begin{pmatrix} \mathbf{1} \\ 2 \\ 2 \\ 6 \\ \mathbf{2} \\ 4 \end{pmatrix},$$

and wherein the differences between the vector $r_6$ and the vector $r_6'$ are indicated in boldface. In particular, in table 1, the set of information bit indices I calculated by means of the row selection algorithm following the distance criterion according to embodiments of the invention and the set of information bit indices obtained by using the conventional criterion based on transmission reliability are shown for different dimensions K. In table 1, the differences between the two sets of information bit indices are indicated in boldface.

TABLE 1

Distance properties of multi-kernel polar codes according to embodiments of the invention.

| | | Dimension K | | |
|---|---|---|---|---|
| | | 1 | 2 | 3 |
| design by reliability | Information Set | [$u_5$] | [$u_4$, $u_5$] | [$u_2$, $u_4$, $u_5$] |
| | Minimum distance | 4 | 4 | 2 |
| design by distance | Information Set | [$u_3$] | [$u_4$, $u_5$] | [$u_0$, $u_4$, $u_5$] |
| | Minimum distance | 6 | 4 | 3 |

The bit positions or indices of $u_6$ ordered according a decreasing reliability are [5,4,2,3,1,0]. For example, if the coding rate is fixed to R=½, which means that there are K=3 information bits (R=K/N), then the 3 information bits are put in the 3 most reliable bit positions, corresponding to the bits [$u_5, u_4, u_2$], while the 3 less reliable bits are fixed to o, i.e., they are frozen bits. Therefore, according to the classical construction of polar codes, the set of indices {5,4,2} of the input vector $u_6$ defines the set of information bit indices I, while the remaining indices, namely the set of indices {3,1,0}, form the set of frozen bit indices F.

As it can be taken from table 1, the row selection algorithm according to embodiments of the invention, finds the set of information bit indices leading to the minimum distance as determined by the distance spectrum, and the code construction according to embodiments of the invention leads to a larger minimum distance than the code construction according to the criterion based on transmission reliability.

For example, let us assume that a polar code $c_6$ of dimension N=6 is generated by encoding an information bit (K=1) by means of the generator matrix $G_6$ according to the formula:

$$c_6 = u_6 \cdot G_6,$$

wherein $u=(u_0, u_1, u_2, u_3, u_4, u_5)$ comprises the information bit and N−K=5 frozen bits. According to the row selection algorithm implemented in embodiments of the invention, the fourth element of the vector $u_6$ should correspond to the information bit, because the maximum value of the minimum distance (in this case 6) among all possible values of the minimum distance, a codeword can have, corresponds to the fourth element of the vector $r_6$.

Once the input vector $u_6$ is encoded generating the polar code $c_6$, then the channel encoder 110 can send the polar code $c_6$ to the channel decoder 130 over the communication channel 120. The channel decoder 130 can be a successive cancellation (SC) decoder, configured to decode the polar code $c_6$.

In the SC decoder, input bits (on the left side of FIG. 3) are decoded successively from top to bottom by propagating the log-likelihood ratio (LLR) values from right to left and hard-decisions from left to right (e.g., see the work by Arikan). The LLRs $L_0^{(0)}, \ldots, L_0^{(5)}$ appearing at the right side correspond to the channel observations. In particular, the code of length N=6 has s=2 stages. LLRs and hard-decisions can be computed according to update functions (e.g., see the work by Arikan). As an alternative to SC decoding, SC list decoding (see "List decoding of polar codes," by Tal et al., in IEEE ISIT, July 2011) or similar methods may be applied at the channel decoder 130.

Embodiments of the invention realize different advantages, such as the generation of multi-kernel polar codes based on a minimum distance criterion, and on the kernel $T_3$. In order to lower the computational complexity of the construction of polar codes, a simple greedy algorithm is given in order to generate the set of information bit indices (and hence the set of frozen bit indices) of multi-kernel polar codes. In particular, the complexity of the algorithm according to embodiments of the invention is much lower than the complexity of state-of-the-art algorithms based on density evolution or similar methods. Therefore, embodiments of the invention lead to a lower encoding and decoding latency. Moreover, the encoding or decoding algorithm according to embodiments of the invention is more efficient compared to prior art algorithms (e.g., see aforementioned the work by Arikan), for which a mother code has to be punctured or shortened in order to get the same block length, and decoding has to be performed on a longer mother code.

Figure 4:
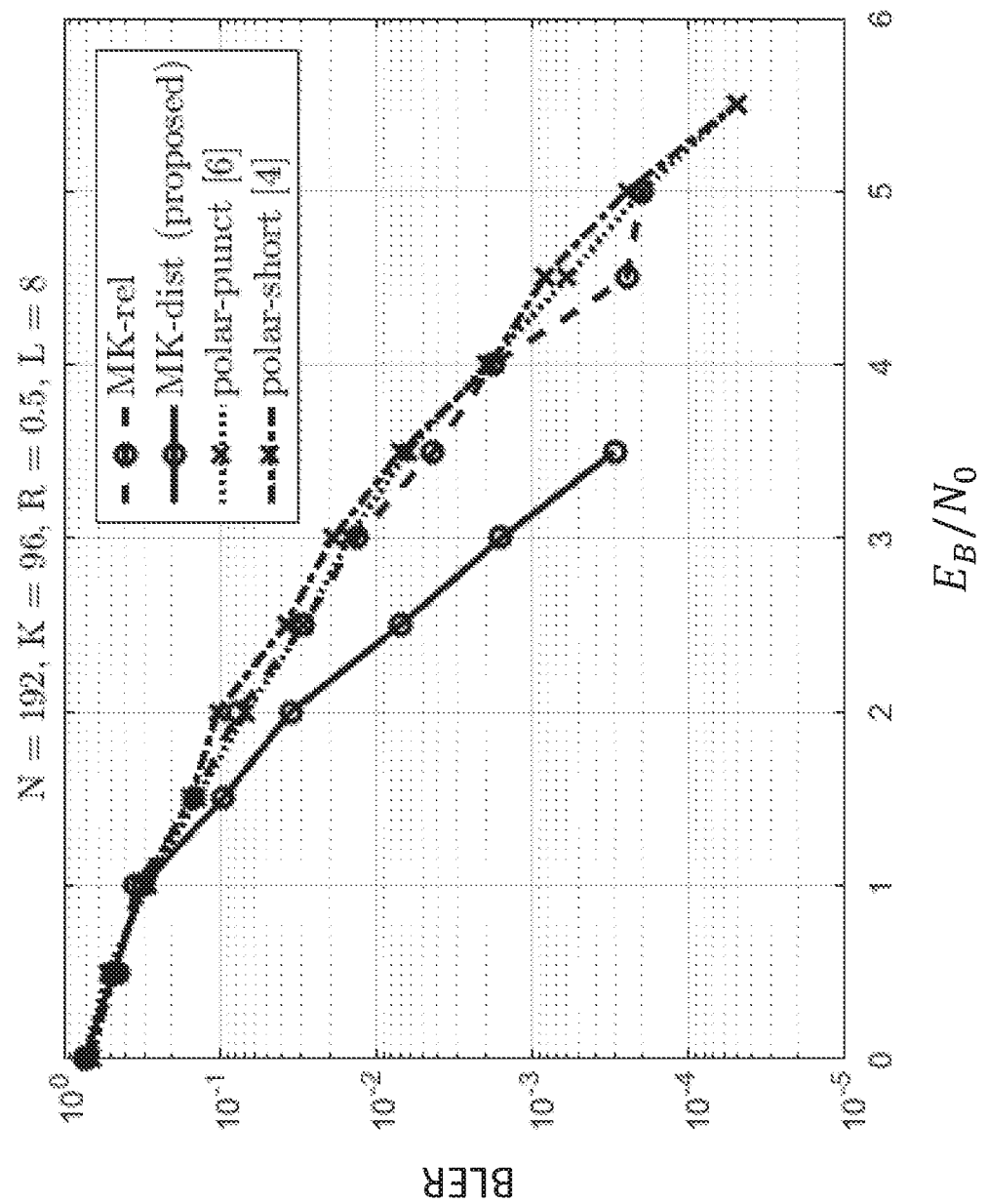
FIG. 4 shows a graph illustrating the performance of a polar code according to an embodiment.

FIG. 4 shows a graph illustrating the performance of a polar code according to an embodiment. In this embodiment, the block error rate (BLER) of a polar code is shown as a function of the signal to noise ration $E_b/N_0$ in dB. In this embodiment, a multi-kernel polar code of size N=192 and dimension K=96 is decoded using the SC-list decoding method (see the aforementioned work of Tal et al.) with list size L=8 for a transmission with binary phase shift keying (BPSK) over an additive white Gaussian noise (AWGN) channel. In this embodiment, the generator matrix is given by $G_{192} = T_2^{\otimes 6} \otimes T_3$, i.e., there is only one $T_3$ kernel at the rightmost of the Kronecker product, and the row selection algorithm is optimal. The performance (BLER) of the multi-kernel polar code according to embodiments of the invention is depicted as MK-dist and is compared to the performance of the multi-kernel polar codes generated on the basis of the conventional transmission reliability method, depicted as MK-rel. In particular, the case MK-dist refers to multi-kernel polar codes generated by using the row selection algorithm according to embodiments of the invention. Moreover, in FIG. 4, the performances of a polar code generated by means of a puncturing method and of a polar code generated by means of a shortening method are also depicted as reference cases. In particular, the shortened polar code is depicted as polar-short and corresponds to the one proposed in "A Novel Puncturing Scheme for Polar Codes", Wang et. al., IEEE Comm. Lett., December 2014, while the punctured polar code, depicted as "polar-punct", is the QUP construction proposed in "Beyond Turbo Codes: Rate-Compatible Punctured Polar Codes", C. Kai et. al, IEEE ICC, June 2013.

As it can be seen in FIG. 4, the multi-kernel polar code according to embodiments of the invention has a better performance, namely a lower BLER at a certain $E_b/N_0$, than the other polar codes.

Figure 5:
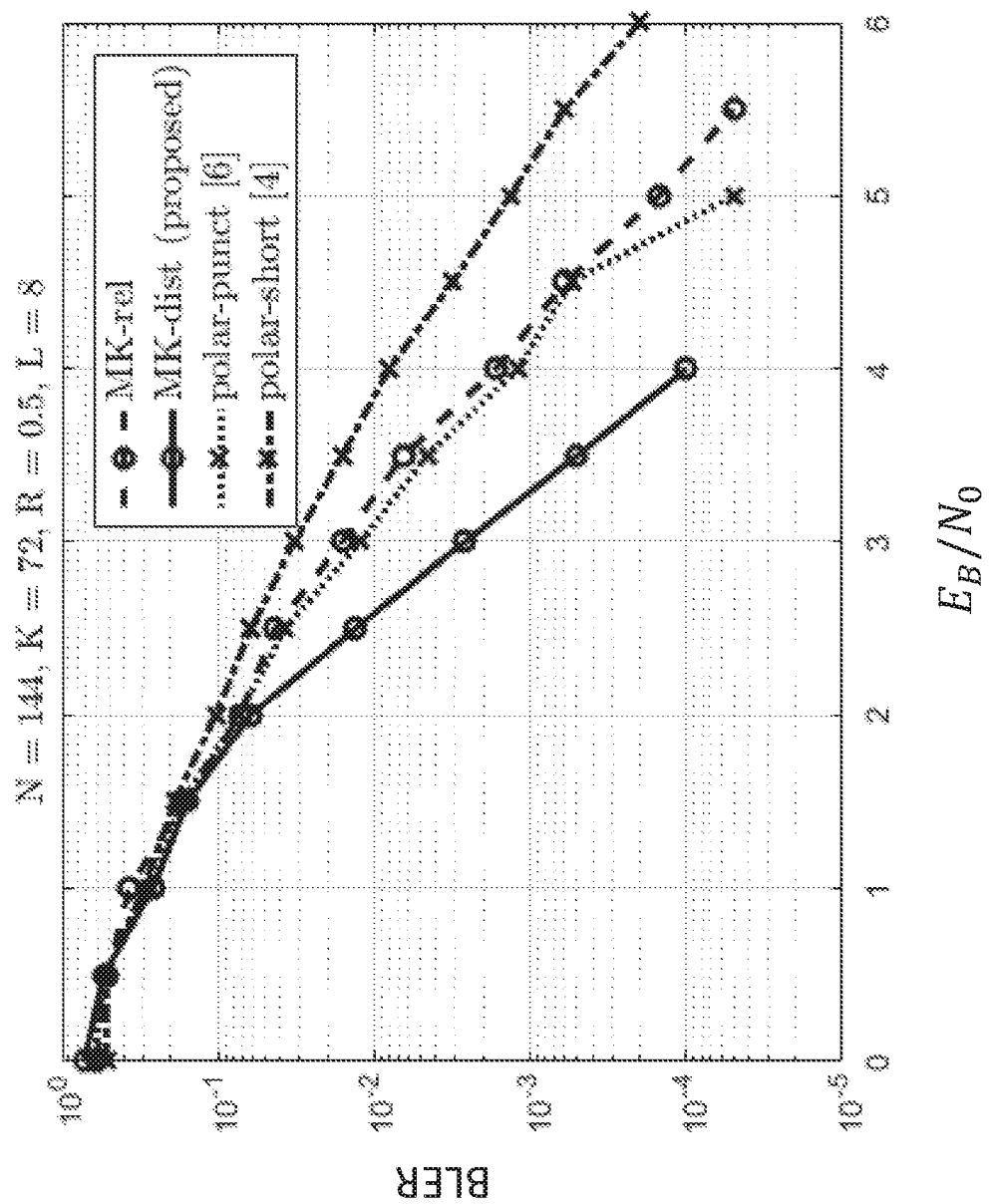
FIG. 5 shows a graph illustrating the performance of a polar code according to an embodiment.

FIG. 5 shows a graph illustrating the performance of a polar code according to an embodiment. In this embodiment, analogously to FIG. 4, the block error rate (BLER) of a polar code is shown as a function of the signal to noise ration $E_b/N_0$ in dB. In this embodiment, a multi-kernel polar code of size N=144 and dimension K=72 is decoded using the SC-list decoding method with list size L=8. In this embodiment, the generator matrix is given by $G_{144} = T_2^{\otimes 4} \otimes T_3^{\otimes 2}$, i.e., there are two $T_3$ kernels at the rightmost of the Kronecker product. In this embodiment, the row selection algorithm used to generate the multi-kernel polar code is not as optimal as the one used to generate the polar code described with reference to FIG. 4, in which only one $T_3$ kernel is at the rightmost of the Kronecker product. The performance of the multi-kernel polar code (BLER) generated according to embodiments of the invention is compared to the performance of polar code generated using other methods as already described in the context of FIG. 4. In this case as well, the multi-kernel polar code according to embodiments of this invention (MK-dist) outperforms the other polar codes.

Figure 6:
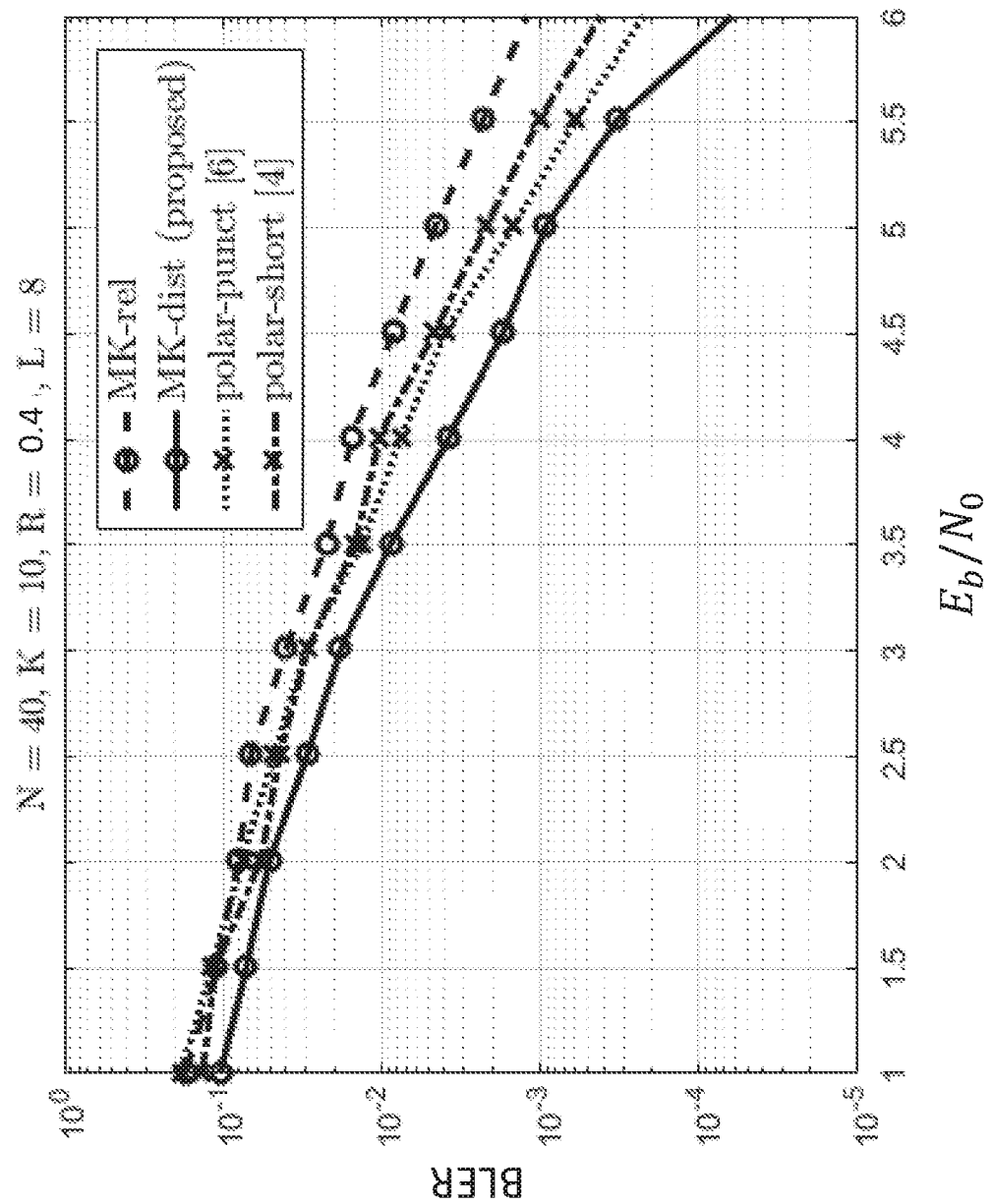
FIG. 6 shows a graph illustrating the performance of a polar code according to an embodiment.

FIG. 6 shows a graph illustrating the performance of a polar code according to an embodiment. In this embodiment, analogously to FIGS. 4 and 5, the block error rate (BLER) of a polar code is shown as a function of the signal to noise ration $E_b/N_0$ in dB. In this embodiment, a multi-kernel polar code of size N=40, dimension K=10 and rate $$R = \frac{K}{N} = 0.4$$

is decoded using the SC-list decoding method with list size L=8. In this embodiment, the generator matrix is given by $G_{40}=T_2^{\otimes 3} \otimes T_5$, wherein the kernel $T_5$ is defined by:

$$T_5 = \begin{pmatrix} 1 & 1 & 1 & 1 & 1 \\ 1 & 0 & 0 & 0 & 0 \\ 1 & 0 & 0 & 1 & 0 \\ 1 & 1 & 1 & 0 & 0 \\ 0 & 0 & 1 & 1 & 1 \end{pmatrix}.$$

Since there is only a $T_5$ kernel at the rightmost of the Kronecker product of the generator matrix, in this case as well, the row selection algorithm provided by embodiments of the invention is optimal. The kernel $T_5$ as well complies with the assumptions on the kernel as described above, and, therefore, the multi-kernel polar code according to embodiments of this invention (MK-dist) outperforms the other polar codes.

Figure 7:
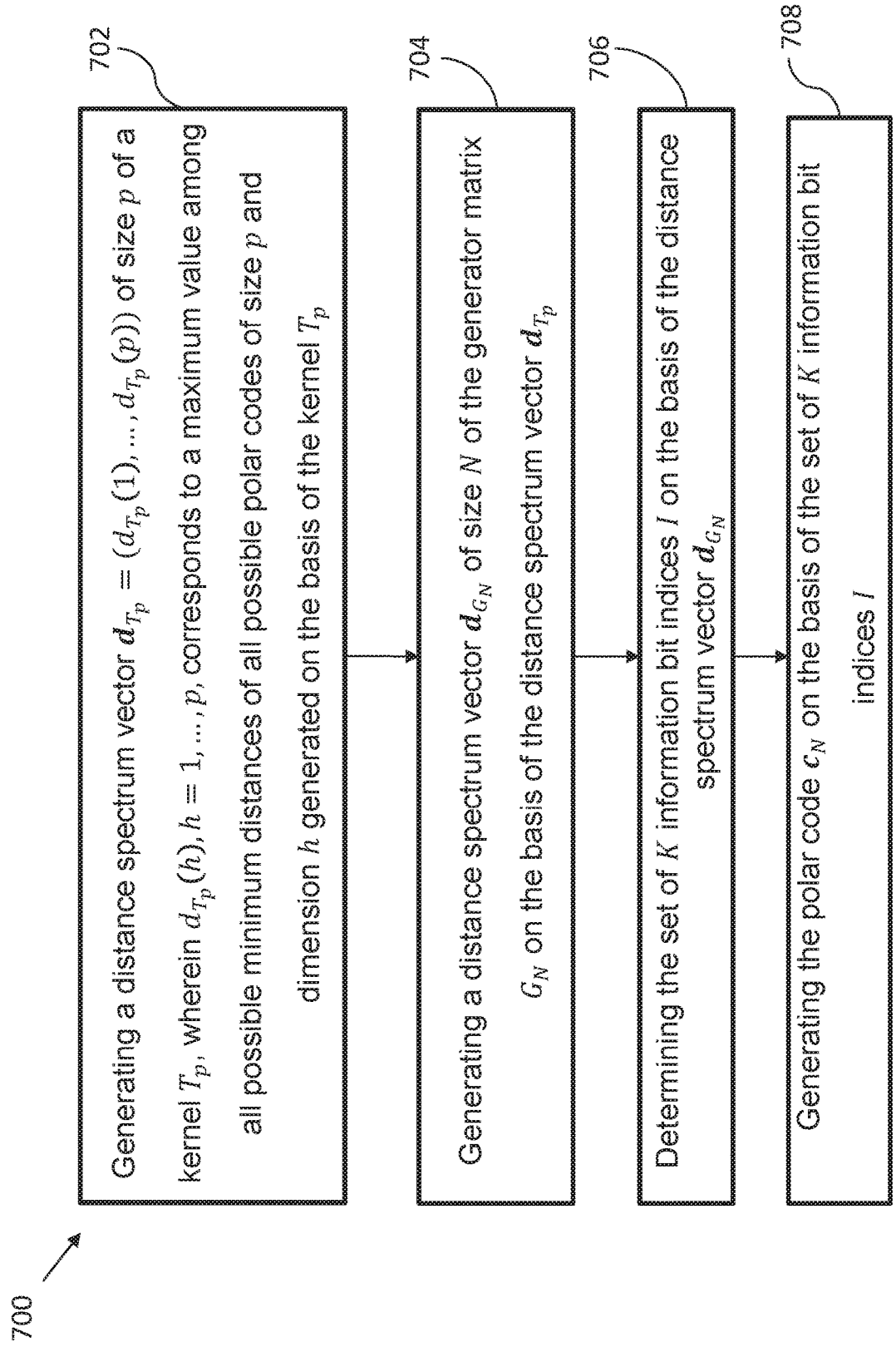
FIG. 7 shows a schematic diagram of a method for generating a polar code according to an embodiment.

FIG. 7 shows a schematic diagram of a corresponding method 700 for generating a polar code according to an embodiment. In this embodiment, the polar code $c_N$ has a length N and dimension K and is generated on the basis of a generator matrix $G_N$ of size N×N, wherein the generator matrix $G_N$ is based on a kernel $T_p$ of size p×p, with p≤N, wherein the polar code $c_N$ is given by $c_N=u_N \cdot G_N$, wherein $u_N=(u_0, \ldots, u_{N-1})$ is a vector of size N, $u_i$, i=0, ... N−1, corresponding to an information bit if i∈I, I being a set of K information bit indices, and $u_i=0$, if i∈F, F being a set of N−K frozen bit indices. The method 700 comprises the following steps: generating 702 a distance spectrum vector $d_{T_p}=(d_{T_p}(1), \ldots, d_{T_p}(p))$ of size p of the kernel $T_p$, wherein $d_{T_p}(h)$, h=1, ..., p, corresponds to a maximum value among all possible minimum distances of all possible polar codes of size p and dimension h generated on the basis of the kernel $T_p$; generating 704 a distance spectrum vector $d_{G_N}$ of size N of the generator matrix $G_N$ on the basis of the distance spectrum vector $d_{T_p}$; determining 706 the set of K information bit indices I on the basis of the distance spectrum vector $d_{G_N}$; and generating 708 the polar code $c_N$ on the basis of the set of K information bit indices I.

While a particular feature or aspect of the disclosure may have been disclosed with respect to only one of several implementations or embodiments, such feature or aspect may be combined with one or more other features or aspects of the other implementations or embodiments as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present invention has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein

What is claimed is:

1. An apparatus, comprising:
   a processor; and
   a computer-readable storage medium storing a program to be executed by the processor, the program including instructions for:
   generating a distance spectrum vector $d_{T_p}=(d_{T_p}(1), \ldots, d_{T_p}(p))$ of size p of a kernel $T_p$, wherein the kernel $T_p$ has a size p×p, with p<N, and wherein $d_{T_p}(h)$, for each h of h=1, ..., p, and corresponds to a maximum value among all possible minimum distances of all possible polar codes of size p and dimension h generated by selecting h rows of the kernel $T_p$;
   generating a distance spectrum vector $d_{G_N}$ of size N of a generator matrix $G_N$ on the basis of the distance spectrum vector $d_{T_p}$, wherein the generator matrix $G_N$ has a size N×N, the generator matrix $G_N$ is based on the kernel $T_p$;
   determining a set of K information bit indices I on the basis of the distance spectrum vector $d_{G_N}$;
   recording a polar code $c_N$ on the basis of the set of K information bit indices I, wherein the polar code $c_N$ has a length N and a dimension K, wherein the polar code $c_N$ is given by $c_N=u_N \cdot G_N$, wherein $u_N=(u_0, \ldots, u_{N-1})$ is a vector of size N, $u_i$, i=0, ... N−1, corresponding to an information bit if i∈I, I being the set of K information bit indices, and $u_i=0$, if i∈F, F being a set of N−K frozen bit indices;
   encoding first data using the recorded polar code $c_N$; and
   transmitting the encoded first data to a second apparatus.

2. The apparatus of claim 1, wherein p=3, and the kernel $T_3$ is given by:

$$T_3 = \begin{pmatrix} 1 & 1 & 1 \\ 1 & 0 & 1 \\ 0 & 1 & 1 \end{pmatrix}.$$

3. The apparatus of claim 2, wherein the generator matrix $G_N$ is given by:

$G_N = G'_n \otimes T_3$; and wherein $G'_n$ represents a first additional generator matrix and ⊗ represents the Kronecker product operator.

4. The apparatus of claim 3, wherein the program further includes instructions for:
generating the distance spectrum vector $d_{G_N}$ of the generator matrix $G_N$ on the basis of the following:

$$d_{G_N} = d_{G'_n} \otimes d_{T_3},$$

wherein $d_{G'_n}$ is the distance spectrum vector of the first additional generator matrix $G'_n$ and $d_{T_3}=(3,2,1)$ is the distance spectrum vector of the kernel $T_3$.

5. The apparatus of claim 1, wherein p=5 and the kernel $T_5$ is given by:

$$T_5 = \begin{pmatrix} 1 & 1 & 1 & 1 & 1 \\ 1 & 0 & 0 & 0 & 0 \\ 1 & 0 & 0 & 1 & 0 \\ 1 & 1 & 1 & 0 & 0 \\ 0 & 0 & 1 & 1 & 1 \end{pmatrix}.$$

6. The apparatus of claim 5, wherein the generator matrix $G_N$ is given by:

$$G_N = G''_m \otimes T_5; \text{ and}$$

wherein $G''_m$ represents a second additional generator matrix and $\otimes$ represents the Kronecker product operator.

7. The apparatus of claim 6, wherein the program further includes instructions for:
generating the distance spectrum vector $d_{G_N}$ of the generator matrix $G_N$ on the basis of the following:

$$d_{G_N} = d_{G''_m} \otimes d_{T_5}; \text{ and}$$

wherein $d_{G''_m}$ is the distance spectrum vector of the second additional generator matrix $G''_m$ and $d_{T_5}=(5,3,2,1,1)$ is the distance spectrum vector of the kernel $T_5$.

8. The apparatus of claim 1, wherein the first row of the kernel $T_p$ has a maximum Hamming weight among all rows of the kernel $T_p$.

9. The apparatus of claim 8, wherein the generator matrix $G_N$ is:

$$G_N = G_q \otimes G_p,$$

wherein $G_q$ is a third generator matrix of a code of size q and $G_p$ is a fourth generator matrix of a code of size p, and wherein the program further includes instructions for:
generating a vector $r_{G_p} = (d_{G_p}(1), d_{G_p}(p-1), d_{G_p}(p-2) \ldots, d_{G_p}(2), d_{G_p}(2))$ of size p;
generating an auxiliary vector:

$$r'_{G_p} = (d_{G_p}(p), d_{G_p}(p-1), d_{G_p}(p-2) \ldots, d_{G_p}(2), d_{G_p}(2))$$
of size p;

generating a vector $r_{G_N} = d_{G_q}^{rev} \otimes r_{G_p}$ of size q·p, wherein the vector $d_{G_q}^{rev}$ is the reverse of a distance spectrum vector $d_{G_q}$, $d_{G_q}$ being the distance spectrum vector of the third generator matrix $G_q$;
generating a vector $r'_{G_N} = d_{G_q}^{rev} \otimes r'_{G_p}$;
determining, for i=1, ..., K, a position l of the last largest entry of the vector $r_{G_N}$;
adding l to the set of K information bit indices I;
setting $r_{G_N}(l)$ equal to zero;
removing, when l=0 mod p, from the set of frozen bit indices F, an index t equal to l−p+1;
substituting the index t by l−1;
setting $r_{G_p}(l−1)=0$; and
setting $r_{G_p}(l−p+1)=r'_{G_p}(l−p+1)$.

10. A method, comprising:
generating, by a device, a distance spectrum vector $d_{T_p} = (d_{T_p}(1), \ldots, d_{T_p}(p))$ of size p of a kernel $T_p$, wherein the kernel $T_p$ has a size p×p, with p<N, and wherein $d_{T_p}(h)$, for each h of h=1, ..., p, and corresponds to a maximum value among all possible minimum distances of all possible codes of size p and dimension h generated by selecting h rows of the kernel $T_p$;
generating, by the device, a distance spectrum vector $d_{G_N}$ of size N of a generator matrix $G_N$ on the basis of the distance spectrum vector $d_{T_p}$, wherein the generator matrix $G_N$ has a size N×N, the generator matrix $G_N$ is based on the kernel $T_p$;
determining, by the device, a set of K information bit indices I on the basis of the distance spectrum vector $d_{G_N}$;
recording, by the device, a polar code $c_N$ on the basis of the set of K information bit indices I, wherein to polar code $c_N$ has a length N and a dimension K, wherein the polar code $c_N$ is given by $c_N = u_N \cdot G_N$, wherein $u_N = (u_0, \ldots, u_{N-1})$ is a vector of size N, $u_i$, i=0, ... N−1, corresponding to an information bit if i∈I, I being the set of K information bit indices, and $u_i=0$, if i∈F, F being a set of N−K frozen bit indices;
encoding, by the device, first data using the recorded polar code $c_N$; and
transmitting, by the device, the encoded first data to a second apparatus.

11. The method of claim 10, wherein p=3, and the kernel $T_3$ is given by:

$$T_3 = \begin{pmatrix} 1 & 1 & 1 \\ 1 & 0 & 1 \\ 0 & 1 & 1 \end{pmatrix}.$$

12. The method of claim 11, wherein the generator matrix $G_N$ is given by:

$$G_N = G'_n \otimes T_3; \text{ and}$$

wherein $G'_n$ represents a first additional generator matrix and $\otimes$ represents the Kronecker product operator.

13. The method of claim 12, further comprising:
generating the distance spectrum vector $d_{G_N}$ of the generator matrix $G_N$ on the basis of the following:

$$d_{G_N} = d_{G'_n} \otimes d_{T_3},$$

wherein $d_{G'_n}$ is the distance spectrum vector of the first additional generator matrix $G'_n$ and $d_{T_3}=(3,2,1)$ is the distance spectrum vector of the kernel $T_3$.

14. The method of claim 10, wherein p=5 and the kernel $T_5$ is given by:

$$T_5 = \begin{pmatrix} 1 & 1 & 1 & 1 & 1 \\ 1 & 0 & 0 & 0 & 0 \\ 1 & 0 & 0 & 1 & 0 \\ 1 & 1 & 1 & 0 & 0 \\ 0 & 0 & 1 & 1 & 1 \end{pmatrix}.$$

15. The method of claim 14, wherein the generator matrix $G_N$ is given by:

$$G_N = G''_m \otimes T_5; \text{ and}$$

wherein $G''_m$ represents a second additional generator matrix and $\otimes$ represents the Kronecker product operator.

16. The method of claim 15, further comprising:
generating the distance spectrum vector $d_{G_N}$ of the generator matrix $G_N$ on the basis of the following:

$$d_{G_N} = d_{G''_m} \otimes d_{T_5}; \text{ and}$$

wherein $d_{G''_m}$ is the distance spectrum vector of the second additional generator matrix $G''_m$ and $d_{T_5}=(5,3,2,1,1)$ is the distance spectrum vector of the kernel $T_5$.

17. The method of claim 10, wherein the first row of the kernel $T_p$ has a maximum Hamming weight among all rows of the kernel $T_p$.

18. The method of claim 17, wherein the generator matrix $G_N$ is:

$$G_N = G_q \otimes G_p,$$

wherein $G_q$ is a third generator matrix of a code of size q and $G_p$ is a fourth generator matrix of a code of size p, and wherein the method comprises:
generating a vector $r_{G_p}=(d_{G_p}(1), d_{G_p}(p-1), d_{G_p}(p-2) \ldots, d_{G_p}(2), d_{G_p}(2))$ of size p;
generating an auxiliary vector: $r'_{G_p}=(d_{G_p}(p), d_{G_p}(p-1), d_{G_p}(p-2) \ldots, d_{G_p}(2), d_{G_p}(2))$ of size p;
generating a vector $r_{G_N} = d_{G_q}^{rev} \otimes r_{G_p}$ of size q·p, wherein the vector $d'_{G_q}^{rev}$ is the reverse of a distance spectrum vector $d_{G_q}$, $d_{G_q}$ being the distance spectrum vector of the third generator matrix $G_q$;
generating a vector $r'_{G_N} = d_{G_q}^{rev} \otimes r'_{G_p}$;
determining, for $i=1, \ldots, K$, a position l of the last largest entry of the vector $r_{G_N}$;
adding l to the set of K information bit indices I;
setting $r_{G_N}(l)$ equal to zero;
removing, when $l \equiv 0 \mod p$, from the set of frozen bit indices F, an index t equal to $l-p+1$;
substituting the index t by $l-1$;
setting $r_{G_p}(l-1)=0$; and
setting $r_{G_p}(l-p+1)=r'_{G_p}(l-p+1)$.

19. A method, comprising:
generating, by a device, a distance spectrum vector $d_{T_p} = (d_{T_p}(1), \ldots, d_{T_p}(p))$ of size p of a kernel $T_p$, wherein the kernel $T_p$ has a size p×p, with p<N, and wherein $d_{T_p}(h)$, for each h of $h=1, \ldots, p$, and corresponds to a maximum value among all possible minimum distances of all possible codes of size p and dimension h generated spanned by h rows of the kernel $T_p$;
generating, by the device, a distance spectrum vector $d_{G_N}$ of size N of a generator matrix $G_N$ on the basis of the distance spectrum vector $d_{T_p}$, wherein the generator matrix $G_N$ has a size N×N, the generator matrix $G_N$ is based on the kernel $T_p$;
determining, by the device, a set of K information bit indices I on the basis of the distance spectrum vector $d_{G_N}$;
recording, by the device, a polar code $c_N$ on the basis of the set of K information bit indices I, wherein to polar code $c_N$ has a length N and a dimension K, wherein the polar code $c_N$ is given by $c_N = u_N \cdot G_N$, wherein $u_N = (u_0, \ldots, u_{N-1})$ is a vector of size N, $u_i$, $i=0, \ldots N-1$, corresponding to an information bit if $i \in I$, I being the set of K information bit indices, and $u_i=0$, if $i \in F$, F being a set of N−K frozen bit indices;
encoding, by the device, first data using the recorded polar code $c_N$; and
transmitting, by the device, the encoded first data to a second apparatus.

20. The method of claim 19, wherein p=3, and the kernel $T_3$ is given by:

$$T_3 = \begin{pmatrix} 1 & 1 & 1 \\ 1 & 0 & 1 \\ 0 & 1 & 1 \end{pmatrix}.$$

* * * * *

UNITED STATES PATENT AND TRADEMARK OFFICE
CERTIFICATE OF CORRECTION

PATENT NO. : 10,924,137 B2
APPLICATION NO. : 16/443105
DATED : February 16, 2021
INVENTOR(S) : Gabry et al.

It is certified that error appears in the above-identified patent and that said Letters Patent is hereby corrected as shown below:

In the Claims

In Column 17, Lines 26-27, Claim 18, delete "generating a vector $r'_{G_N} = {}^{rev}_{G_q} \otimes r'_{G_p}$ of size $q \cdot p$, wherein the vector $d'{}^{rev}_{G_q}$ is the reverse" and insert --generating a vector $r_{G_N} = d^{rev}_{G_q} \otimes r_{G_p}$ of size $q \cdot p$, wherein the vector $d^{rev}_{G_q}$ is the reverse--.

Signed and Sealed this
Twenty-fifth Day of May, 2021

Drew Hirshfeld
*Performing the Functions and Duties of the
Under Secretary of Commerce for Intellectual Property and
Director of the United States Patent and Trademark Office*